United States Patent [19]

Farrall et al.

[11] Patent Number: 4,620,123

[45] Date of Patent: Oct. 28, 1986

[54] SYNCHRONOUSLY OPERABLE ELECTRICAL CURRENT SWITCHING APPARATUS HAVING MULTIPLE CIRCUIT SWITCHING CAPABILITY AND/OR REDUCED CONTACT RESISTANCE

[75] Inventors: George A. Farrall, Rexford; John H. Van Noy, Ballston, both of N.Y.

[73] Assignee: General Electric Company, Schenectady, N.Y.

[21] Appl. No.: 684,882

[22] Filed: Dec. 21, 1984

[51] Int. Cl.[4] .............................................. H01L 41/08

[52] U.S. Cl. .................................... 310/331; 310/332; 200/181

[58] Field of Search ................................ 310/330-332; 200/181

[56] References Cited

U.S. PATENT DOCUMENTS

| | | | |
|---|---|---|---|
| 2,166,763 | 7/1939 | Mason | 175/320 |
| 2,182,340 | 12/1939 | Hearn | 178/71 |
| 2,471,967 | 5/1949 | Mason | 171/327 |
| 2,835,761 | 5/1958 | Crownover | 200/87 |
| 2,842,685 | 7/1958 | Petermann et al. | 310/331 X |
| 3,110,824 | 11/1963 | Flanagan | 310/330 |
| 3,292,111 | 12/1966 | Cotton | 335/3 |
| 3,381,226 | 4/1968 | Jones et al. | 328/3 |
| 3,486,042 | 12/1969 | Watrous | 307/252 |
| 3,688,135 | 8/1972 | Koda et al. | 310/8.5 |
| 4,074,333 | 2/1978 | Murakami et al. | 361/13 |
| 4,093,883 | 6/1978 | Yamamoto | 310/332 X |
| 4,112,279 | 9/1978 | Brohard | 310/332 |
| 4,403,166 | 9/1983 | Tanaka et al. | 310/332 |
| 4,420,266 | 12/1983 | Kolm et al. | 310/332 X |
| 4,450,375 | 5/1984 | Siegel | 310/332 X |
| 4,473,859 | 9/1984 | Stone et al. | 310/330 X |

FOREIGN PATENT DOCUMENTS

| | | | |
|---|---|---|---|
| 273157 | 7/1964 | Australia | 310/331 |
| 0067883 | 12/1982 | European Pat. Off. . | |
| 0060005 | 5/1977 | Japan | 310/332 |

*Primary Examiner*—Mark O. Budd

*Attorney, Agent, or Firm*—Jeffrey L. Brandt; James C. Davis, Jr.; Paul R. Webb, II

[57] ABSTRACT

A synchronously operable electrical current switching apparatus which may be used to switch multiple circuits, or to lower the contact resistance in one or more circuits, or both, includes a plurality of piezoelectric benders of the type having at least two electrically conductive layers separated by a piezoelectric material, and which exhibit bending motion in a direction substantially perpendicular to the plane in which the benders lie in response to an applied electrical signal. The apparatus also includes at least one pair of switching contacts, with one contact being movable and mechanically linked to at least one bender so that the bending motion causes corresponding movement of the contact and produces a change in the relative position of the contacts between open and closed positions. One of the electrically conductive layers of each bender is connected to the electrical signal by a common electrical conductor. For predetermined ones of the benders, a second one of the electrically conductive layers is connected to the electrical signal by a separate conductor, so that those benders exhibit bending motion in response to the signal. One pair of contacts may be provided for each bender, or a number of benders may be mechanically linked to one movable contact, so that the force exerted on the contact by the benders is increased.

7 Claims, 5 Drawing Figures

SYNCHRONOUSLY OPERABLE ELECTRICAL CURRENT SWITCHING APPARATUS HAVING MULTIPLE CIRCUIT SWITCHING CAPABILITY AND/OR REDUCED CONTACT RESISTANCE

RELATED APPLICATIONS

This patent application is related to Application Ser. Nos. 684,880, 684,881, 685,107, 685,108, and 685,109, all assigned to the present assignee and filed concurrently herewith.

BACKGROUND OF THE INVENTION

This invention relates to a piezoelectrically operated apparatus which is useful for switching electrical circuits. More particularly, it relates to piezoelectric circuit elements which are specially constructed to have a combination of multiple circuit switching capability and reduced contact resistance for one or all of the circuits.

Electromagnetic relays have been used in the past to switch a wide range of electrical circuits by separating or closing one or more pairs of electrical contacts. While electromagnetic relays perform satisfactorily for some applications, they can be slow acting, relatively large in size, and costly. They typically require a relatively bulky solenoid coil and associated linkage to provide contact movement. Such coil and linkage systems are, in addition to being a major part of the relay cost, generally energy inefficient. Furthermore, electromagnetic relays do not lend themselves to synchronous operation. Although conventional electromagnetic relays may be employed to switch such loads as, for example, an alternating current electrical circuit on demand, the movement of the contacts is usually random on the time scale of the load current waveform, because of generally long mechanical reaction times associated with the operation of such relays. As a result, opening and closing operations of the contacts are not synchronized with the zero current points of the current waveform, especially when the load is an alternating current circuit. For electrical circuits operating at current levels typical of such power sources as household electrical wiring, opening and closing of the relay contacts is often accompanied by arcing between the contacts. When the current in such a circuit is interrupted, the current through the relay contacts does not drop to zero at the instant of contact separation, but rather persists in the form of an arc between the contacts, usually until the alternating current waveform approaches the next sinusoidal zero. As the current level decreases toward the sinusoidal zero point, the arc becomes unstable and suddenly is extinguished, a phenomenon often referred to as chopping. This sudden extinction at low current represents an extremely high rate of change of current. As a result, if the electrical circuit in which the current is being interrupted has significant inductance, high voltage transients, proportional to the product of the inductance and the rate of change of the current, are produced. These voltage transients may cause electrical breakdown in either the equipment connected with the circuit, or the relay itself, or both. Moreover, such arcing is damaging to the contacts themselves and can cause contact erosion and contact welding. It is therefore desirable to minimize any arcing occurring between the relay contacts when the contacts are opened or closed. One way to minimize such arcing is to operate the relay so as to switch the electrical circuit at a point in the load current waveform where the current level is as close to zero as possible, which operation is referred to hereinafter as synchronous operation.

A piezoelectric device, utilizing the fast action capability of a piezoelectric bender, may be employed to provide a synchronously operable switching relay. Synchronous operation requires that the relay contacts be moved between the open and closed positions in a relatively short period of time. The fast action, relatively low mass, and small travel distance of a piezoelectric bender facilitate the use of such a device in a synchronously operable relay. A further characteristic of a piezoelectric device is that the deflecting force acting to move the contacts is at a maximum at the beginning of the piezoelectric bender's deflection. This characteristic further enhances the device's capability of moving the relay contacts in a short period of time. With this fast action capability, a piezoelectric relay may be operated so that the contacts are opened or closed at a time very close to the time when the current level is zero in the circuit being switched, thereby substantially reducing contact erosion, contact welding, and transient inductive voltages. Also, the simplicity of a piezoelectric device avoids most of the mechanical problems of conventional electromagnetic relays, and the energy efficiency of such a device permits operation with far less expenditure of energy.

Because of their compact size and energy efficiency, piezoelectric relays readily lend themselves to switching multiple circuits. However, the contact closing force available from a piezoelectric bender is relatively small. Moreover, the available force is at a minimum at the end of the bender's deflection. While the force characteristic of a piezoelectric bender, which is at a maximum at the beginning of the bender's travel and at a minimum at the end thereof, is useful for synchronously operating relay contacts, in that such force characteristic gives fast action capability, it also may result in lower residual forces in the closed position of the relay contacts, than is characteristic of an electromagnetic relay. If the residual closing force on the contacts is too small, the electrical resistance of the closed contact interface, conventionally referred to as contact resistance, for a particular circuit may be unacceptably high. High contact resistance results in excessive power loss at the contact interface, and the resistive heating at the interface can lead to a number of contact failure modes. For conventional electromagnetic relays, not only is the closing force available generally high, but the force also is at a maximum at the end of the stroke, which is typically when the relay contacts come together. Thus, the problem of contact resistance, and the considerations involved in reducing it, are different for piezoelectric relays than for electromagnetic relays.

Piezoelectric benders have been used in the past in a number of applications, including utilization in various piezoelectric relays. For example, piezoelectric benders used as relay elements are described in U.S. Pat. Nos. 2,166,763, 2,182,340, 2,471,967, 2,835,761, 4,093,883, and 4,403,166. However, none of the piezoelectric relays disclosed by these patents have been specifically designed to minimize arcing. No consideration has been given to providing a synchronously operable relay, or to one which is especially useful for switching electrical circuits operating at household power line current levels. As has been noted above, switching circuits operating at such current levels results in significant arcing if the circuit is not switched at a point in time close to a sinusoidal zero of the alternating current level. Application Ser. No. 684,881, assigned to the same assignee as the present invention and filed concurrently herewith, discloses a piezoelectric relay having a very small gap length as compared to the contact separation for conventional relays, which relay may be synchronously operated so that, for example, 110 volt alternating current circuits are switched on and off with minimal arcing between the relay contacts. Application Ser. No. 684,880, also assigned to the present assignee and filed concurrently herewith, discloses an electrical current switching apparatus which provides increased separation between the switching contacts when the contacts are in the open position and increased closing force when the contacts are in the closed position. The present invention provides a synchronously operable electrical current switching apparatus which employs a plurality of piezoelectric benders and which may be used to switch multiple circuits or to lower the contact resistance in one or a few circuits.

It is seen from the above that it is an object of the present invention to provide an electrical current switching apparatus that provides a combination of multiple circuit switching capability and reduced contact resistance for one or more circuits.

It is another object of the present invention to provide a multiple circuit switching apparatus which utilizes a plurality of piezoelectric benders in order to reduce the contact resistance of one or more pairs of current switching contacts.

It is a further object of the present invention to provide an electrical current switching apparatus which is fast acting, small in size, highly energy efficient, and low in cost.

It is also an object of the present invention to provide an electrical circuit switching apparatus which is synchronously operable.

SUMMARY OF THE INVENTION

An electrical current switching apparatus is provided which may be used to either switch multiple circuits, or to lower the contact resistance in one or more circuits, or to do both, depending on the contact resistance requirements of the particular application involved. The switching apparatus of the present invention is especially useful for synchronous operation of the circuit being switched. The apparatus comprises a plurality of piezoelectric benders of the type having at least two electrically conductive layers separated by a piezoelectric material, and which exhibit bending motion in a direction substantially perpendicular to the plane in which the benders lie, in response to an applied electrical signal. The apparatus also includes at least one pair of electrical current switching contacts, with one of the contacts being movable and mechanically linked to at least one of the benders so that the bending motion of that benders causes corresponding movement of the movable contact. The current switching contacts are further disposed so that the movement of the movable contact produces a change in the relative position of the contacts between open and closed positions. A common electrical conductor electrically connects one of the electrically conductive layers of each of the piezoelectric benders to the electrical signal. A separate conductor means electrically connects a second one of the electrically conductive layers of predetermined ones of the plurality of benders to the electrical signal, so that the predetermined benders exhibit bending motion in response to that signal. One pair of electrical current switching contacts may be provided for each of the piezoelectric benders, or a number of the benders may be mechanically linked to one movable contact, so as to increase the force exerted on the contact by the bending motion of the benders.

BRIEF DESCRIPTION OF THE DRAWINGS

The subject matter which is regarded as the invention is particularly pointed out and distinctly claimed in the concluding portion of the specification. The invention itself, however, both as to its organization and method of practice, together with further objects and advantages thereof, may best be understood by reference to the following description taken in conjunction with the accompanying drawings, in which:

DETAILED DESCRIPTION OF THE PREFERRED EMBODIMENTS

Figure 1:
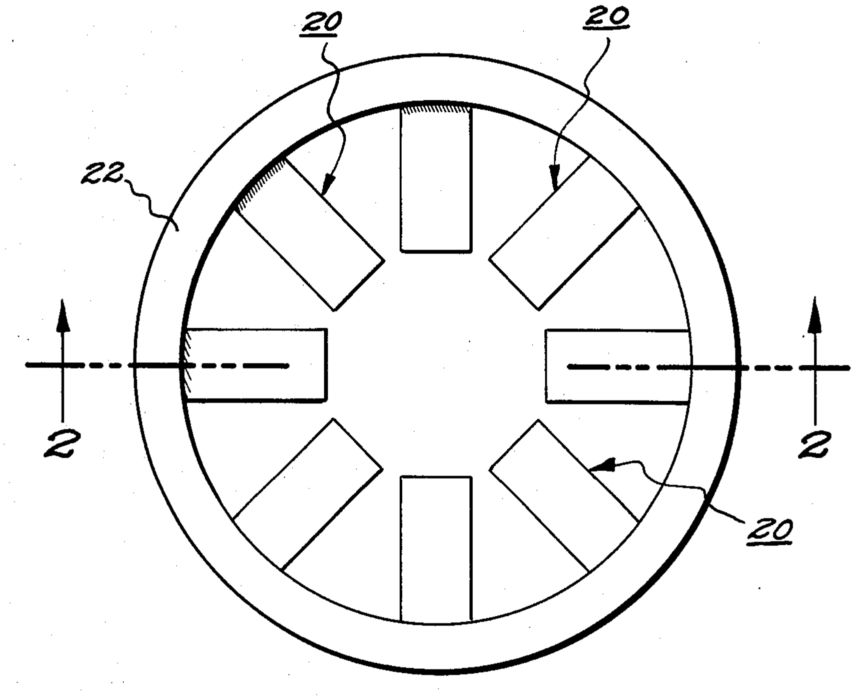
FIG. 1 is a plan view schematically illustrating one embodiment of the present invention.
Figure 2:
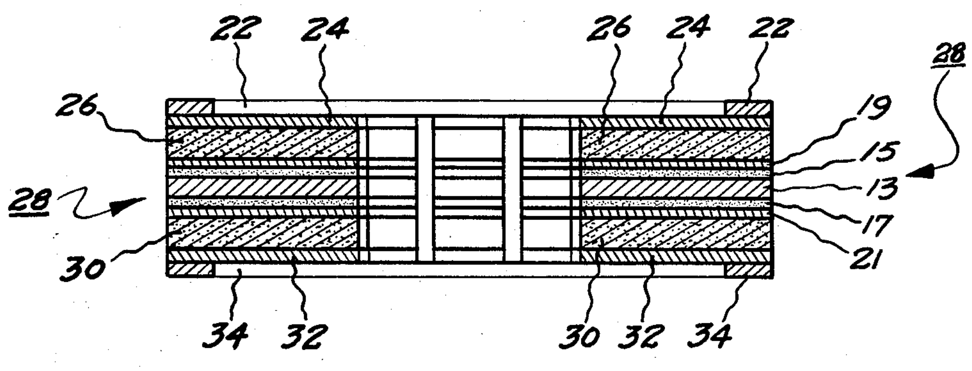
FIG. 2 is a cross-sectional, side elevation view of the apparatus shown in FIG. 1, taken along line 2—2.

FIG. 1 schematically illustrates one embodiment of a synchronously operable electrical current switching apparatus having multiple circuit switching capability and/or reduced contact resistance, in accordance with the present invention. The apparatus comprises a plurality of piezoelectric benders 20, with each bender 20 being of the type having at least two electrically conductive layers separated by a piezoelectric material and exhibiting bending motion, in response to an applied electrical signal, in a direction substantially perpendicular to the plane in which bender 20 lies. As shown in FIG. 2, which is a cross-sectional, side elevation view taken along line 2—2 of the apparatus shown in FIG. 1, each bender 20 preferably comprises a bilateral piezoelectric bender of the type having central electrically conductive layer 28 and two outer electrically conductive layers 24 and 32, with each of outer layers 24 and 32 being separated from central layer 28 by piezoelectric material layers 26 and 30, respectively. In the preferred embodiment of a piezoelectric bender shown in FIG. 2, central electrically conductive layer 28 comprises a 5-layer structure. In this 5-layer structure, spring member 13 provides a central flexible member to facilitate bending motion of the bender. Conductive epoxy layers 15 and 17 serve to fasten the two halves of the bender to central spring member 13. Central conductive layers 19 and 21 provide means for electrically connecting piezoelectric material layers 26 and 30 with external circuitry (not shown). With this bilateral construction, bender 20 exhibits bending motion in one direction in response to a first applied electrical signal, and bending motion in the opposite direction in response to a second applied signal. Electrically conductive layers 24 and 32 and piezoelectric material layers 26 and 30 are arranged so that a flat capacitor, having piezoelectric material as the dielectric, is formed between outer layer 24 and central layer 28, and a similar flat capacitor is formed between outer layer 32 and central layer 28. When one end of bender 20 is clamped and a voltage is applied between outer layer 24 and central layer 28, the electric field across piezoelectric material layer 26 causes the free end of bender 20 to deflect upward. In a similar manner, a voltage applied between outer layer 32 and a central layer 28 causes the free end of bender 20 to deflect downward. Piezoelectric bender 20 may also comprise a monomorph bender, of the type having only two electrically conductive layers separated by a piezoelectric material. However, for applications where there is significant heat buildup in the bender, the symmetrical construction of a bilateral bender is thermally more stable and less likely to undergo significant distortion through differential thermal expansion. Also, since a bilateral bender exhibits bending motion in two, opposite directions in response to appropriate electrical signals, a current switching apparatus employing bilateral benders is operable as either normally open or normally closed, or both. Furthermore, the bilateral capability of bending in opposite directions may be employed to provide a larger separation between the switching contacts when they are in the open position, than would be achievable for a given applied electrical signal using a monomorph bender.

A common electrical conductor electrically connects a first one of the electrically conductive layers of each of piezoelectric benders 20 to the applied electrical signal. A separate conductor means electrically connects a second one of the electrically conductive layers of predetermined ones of benders 20 to the electrical signal, so that the predetermined benders exhibit bending motion in response to the applied signal. The "predetermined" benders are chosen to meet the circuit switching and contact resistance requirements of a particular application, in the manner described hereinbelow. In the embodiment illustrated in FIG. 2, common electrical conductor 22 is in electrical contact with outer conductive layer 24 of each of benders 20. In practice, common electrical conductor 22 is electrically connected to an appropriate electrical signal, not shown in FIG. 2. The electrical signal is also connected to central conductive layer 28 of predetermined ones of benders 20 by a separate conductor means, also not shown in FIG. 2.

Figure 3:
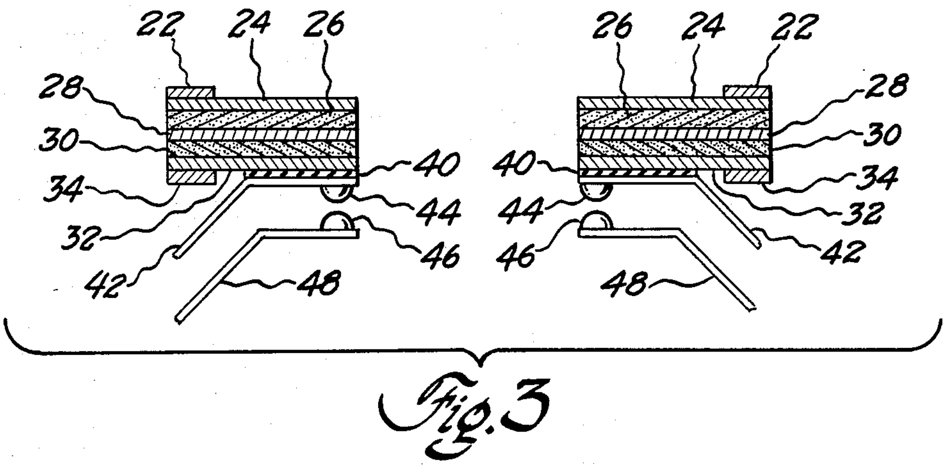
FIGS. 3, 4, and 5 are cross-sectional, side elevation views similar to that of FIG. 2, schematically illustrating alternative embodiments of the electrical current switching contacts of the present invention.
Figure 4:
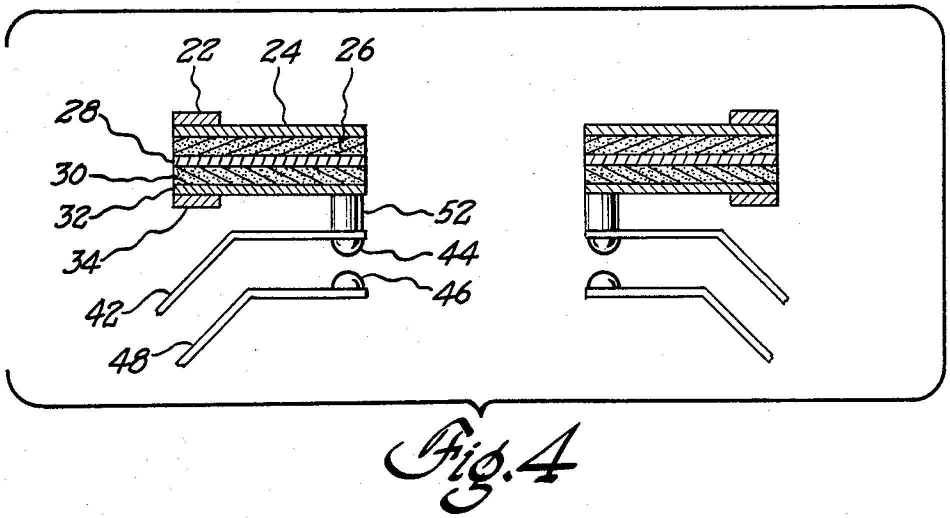
Figure 5:
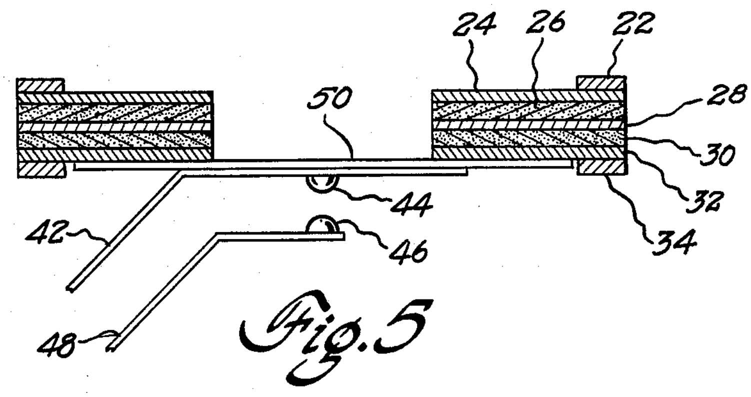

As shown in FIGS. 3–5, which are cross-sectional, side elevation views similar to that of FIG. 2 (with the central portions omitted for the sake of clarity) schematically illustrating alternate contact configurations, the apparatus of the present invention also includes at least one pair of electrical current switching contacts 44 and 46. In each of the embodiments shown, contact 44 is mounted on flexible contact support member 42, and contact 46 is mounted on fixed contact support member 48. Contact 44 is movable and mechanically linked to at least one of piezoelectric benders 20, so that the bending motion of predetermined benders 20 causes corresponding movement of contact 44. Contacts 44 and 46 are disposed so that the movement of contact 44 produces a change in the relative position of contacts 44 and 46 between open and closed positions. In FIG. 3, contact 44 is mechanically linked to bender 20 by being mounted on the outer surface of electrically conductive layer 32 of bender 20. Flexible contact support member 42 and contact 44 are electrically isolated from bender 20 by electrically insulative material 40 disposed between layer 32 and support member 42. In FIG. 4, contact 44 is mounted on flexible contact support member 42 and mechanically linked to bender 20 by spacer 52. Preferably, spacer 52 comprises electrically insulative material. The embodiment of FIG. 4 provides increased dielectric strength between contact 44 and electrically conductive layer 32 of bender 20. For applications where even greater resistance to electrical breakdown between contact 44 and bender 20 is desired, electrically conductive layer 32 may be at least partially covered by a layer of insulative material (not shown in FIG. 4), located between electrically conductive layer 32 and spacer 52.

In the manner shown in FIGS. 1–4, the electrical current switching apparatus of the present invention may be configured so that at least one pair of electrical current switching contacts 44 and 46 is provided for each piezoelectric bender 20. In fact, if desirable, all of the contact pairs may be activated by a single piezoelectric bender. In this embodiment, the apparatus may be used to switch as many electrical circuits as there are pairs of current switching contacts. Thus, the present invention provides a multiple electrical circuit switching apparatus which is fast acting, small in size, highly energy efficient, and low in cost. Alternatively, if the contact resistance between contacts 44 and 46 is unacceptably high for a particular circuit being switched, more than one pair of contacts 44 and 46 may be used to switch that circuit, in order to reduce the contact resistance thereof. It is known from the theory and experiment that contact resistance can be reduced by connecting multiple contact pairs in parallel to the circuit being switched. Thus, contact resistance can be reduced by a factor of n by employing n contact pairs in parallel, rather than one contact pair, to switch the circuit involved. Accordingly, once the contact resistance requirement for a particular circuit is known, and once the contact resistance between contacts 44 and 46 of a particular embodiment of the present invention is determined to be higher than allowable for that circuit, an appropriate number of pairs of contacts 44 and 46 may be determined and connected in parallel to the circuit involved, in order to reduce the contact resistance to an acceptable level. The remaining contact pairs available in the apparatus may be used either singly or in multiples to switch other electrical circuits, according to the number of contact pairs needed to meet the contact resistance requirements of those other circuits.

An alternate method for reducing the contact resistance is to increase the force holding contacts 44 and 46 in the closed position. It is known that contact resistance varies inversely as a power (i.e., exponent) of the force holding the contacts together, with the actual value of the exponent varying from 0.33 to 0.5 depending upon the combined plastic and elastic properties of the contact interface. Thus, choosing a mean value for the exponent of 0.41, if the force is increased by a factor of x, the contact resistance decreases by a factor of $x^{0.41}$. In accordance with the present invention, the contact closing force is increased by mechanically linking contact 44 to more than one of piezoelectric benders 20. The force exerted on contact 44 by the bending motion of benders 20 can be made equal to the sum of the individual forces exerted on contact 44 by each of benders 20 which are mechanically linked to contact 44. In the embodiment illustrated in FIG. 5, contact 44 is mechanically linked to more than one bender 20 by being mounted on linking member 50. Linking member 50 is attached to each of benders 20 which are to be linked to contact 44, and contact 44 is centrally located on linking member 50 with respect to all of benders 20 which are attached to linking member 50. For applications where it is desirable to electrically isolate contact 44 from benders 20, linking member 50 comprises electrically insulative material. The number of benders 20 selectively linked to each contact 44 depends upon the bending force available from each bender 20 and on the closing force required to reduce the contact resistance to an acceptable level. The remaining benders available in the apparatus are linked to other contacts 44, either singly or in multiples, depending upon the contact resistance requirements of the other circuits to be switched. Also, as was discussed above, multiple pairs of contacts 44 and 46 available in the apparatus may be connected in parallel to a particular circuit in order to further reduce the contact resistance. Contact 44 of each of these contact pairs, in turn, may be linked either to only one of benders 20 or to more than one of them.

By means of an appropriate electrical signal, each bender 20 may be made to bend in a direction toward contact 46, in response to the electrical signal, so that the bending motion causes a change in relative position between contacts 44 and 46 from an open position to a closed position. Alternatively, each bender 20 may be made to bend in a direction away from contact 46, so that the bending motion causes a change in relative position between contacts 44 and 46 from a closed position to an open position. Furthermore, if bender 20 comprises a bilateral piezoelectric bender of the type shown in FIG. 2, and if second common electrical conductor 34 electrically connects outer electrically conductive layer 32 of each of benders 20 to the triggering signal, contacts 44 and 46 are operable as either nomrally open, or normally closed, or both. Additionally, although not shown in the Figures, a second assembly of contacts 44 and 46 and contact support members 42 and 48 may be provided and located above electrically conductive layer 24 of bender 20, with this second assembly of elements being configured and disposed symmetrically with respect to the elements shown in the Figures as being located below electrically conductive layer 32. Such an embodiment is useful either to increase the number of switching contact pairs available or to provide switching contacts which are operable as a three position switch.

The materials used to fabricate the various elements of the switching apparatus shown in the Figures may be chosen from a variety of electrically conductive and non-conductive materials, in order to meet the needs of a particular application. For example, central electrical conductive layer 28 of bender 20 preferably comprises a brass leaf, and outer electrically conductive layers 24 and 32 may comprise metal films. Piezoelectric material layers 26 and 30 may comprise a ceramic piezoelectric material. To provide the apparatus with good mechanical strength, common electrical conductors 22 and 34 preferably comprise metal. Flexible contact support member 42 conveniently comprises a phosphor-bronze strip. Also, for the embodiment shown in FIG. 3, contact 44 is conveniently attached to bender 20 by means of a commercially available adhesive backed printed circuit board strip.

Synchronous operation of the electrical current switching apparatus provided by the present invention allows the use of such an apparatus to switch electrical circuits operating at significant current levels, while minimizing arcing between the current switching contacts. If the contacts are operated so that arcing is minimized, erosion of the contacts and the resulting changes in the gap between the contacts are also minimized. With the change in the gap between the contacts being minimized, the relay is operable at very short open-contact gaps, and no significant increase in contact travel distance is required over the operating life of the switching apparatus. The short gap between the contacts which may be used in a synchronously operated switching apparatus in turn allows the contacts to be opened or closed in a short period of time, using a piezoelectric bender. As an example, and not by way of limitation, contacts having a separation of one mil may be opened or closed in about 200 microseconds. The speed with which such a switching apparatus may be operated allows true synchronous operation in such circuits as alternating currents circuits for which either the current waveform is predictable or the sinusoidal zero time points may be determined. In one embodiment, the switching apparatus of the present invention may be synchronously operated in the manner described in the above-referenced application Ser. No. 684,881.

One particularly useful application of the electrical current switching apparatus of the present invention is for synchronously operating electrical circuits which are connected to conventional 110 volt power lines. For such an application, contacts 44 and 46 are further disposed so that, with the contacts in an open position, the distance therebetween is sufficient that the breakdown voltage between contacts 44 and 46 is greater than about 170 volts. The distance between contacts 44 and 46 is, at the same time, sufficiently small, and contact 44 and the associated bender have sufficiently small mass, that contact 44 is movable between the closed and open positions in a time period of less than about 200 microseconds. In one embodiment, the distance between contacts 44 and 46 in the open position is less than about 1 mil, and may be as small as 0.1 mil. Such a small separation between the contacts is much smaller than the contact separation for conventional relays designed for operation with 110 volt alternating current circuits. However, the present inventor has found that even for such short distances between the contacts, the dielectric strength of a piezoelectric device is sufficient for operation with typical 110 volt household power lines. Unexpectedly, sufficient breakdown voltage for such devices can be achieved even for contact separations as small as 0.1 mil. By Paschen's law the breakdown voltage between two electrodes in a gaseous atmosphere is a function of the product of gas pressure and the distance between the electrodes. For an electrode separation of 1 cm. in air at atmospheric pressure, the breakdown voltage can be determined to be approximately 30 kv. If this breakdown field of 30 kv/cm is used to estimate the breakdown voltage of a 1 mil electrode separation in air, as is permissible for separations of a few centimeters, the estimated breakdown voltage is 77 volts. However, it has been found that the breakdown voltage given by Paschen's law does not linearly decrease to zero as the contact separation becomes small, but rather approaches a minimum value and then begins to increase again. For air, this minimum breakdown voltage has been found to be somewhat greater than 300 volts. It is theorized that the reason for this minimum breakdown voltage and subsequent increase in dielectric strength is that, when the product of gas presure and electrode separation is small, the number of gas atoms with which an electron can collide in traversing the gap between the contacts also becomes small. Since the breakdown process in a gas causes the gas to become an electrical conductor and therefore depends critically upon the ability of electrons in the gap to collide with and ionize ambient gas atoms, the probability of establishing a conducting path is reduced when the number of available target atoms is small. It is believed that the breakdown voltage approaches a minimum and then increases again because the breakdown process undergoes a fundamental change fram a gas collison mechanism to an electrode-surface dominated, vacuum-breakdown mechanism, and also because the breakdown voltage of a given contact separation is generally much higher in vacuum than in a gas at atmospheric pressure. Accordingly, the present invention has determined that a piezoelectric relay having a very small separation between the contacts may be synchronously operated so that 110 volt alternating current circuits are switched on and off with minimal arcing between the relay contacts.

Other particularly useful applications of the switching apparatus of the present invention are for synchronously operating electrical circuits of the type which are typically employed as control circuits for household appliances. Load circuit operating voltages for such applications range from as little as 24 volts to more than 340 volts. The load currents for these circuits include both alternating current and direct current waveforms. When the relay of the present invention is employed to switch direct current electrical loads, operation of the relay may be assisted by such conventional controlling means as, for example, voltage clamping circuitry. Finally, it should be noted that the switching apparatus of the present invention may be operated in air, in vacuum, or in an inert atmosphere, with the choice of operating environment being determined by the particular application involved. It should also be noted that the particularly useful applications for the switching apparatus of the present invention described above are provided by way of example, and are not intended to be limiting.

The foregoing describes an electrical current switching apparatus that provides a combination of multiple circuit switching capability and reduced contact resistance for one or more circuits. The apparatus may be used to individually control a large number of separate electrical circuits. The apparatus may also be used to reduce the contact resistance for one or more circuits, by either connecting more than one pair of current switching contacts in parallel, or by mechanically linking more than one piezoelectric bender to one movable contact, or by both methods. The present invention thus provides a very flexible switching apparatus. Furthermore, the switching apparatus of the present invention is synchronously operable so that minimal arcing occurs between the switching contacts. The apparatus also utilizes a plurality of piezoelectric benders which are fast acting, small in size, highly energy efficient, and low in cost.

While the invention has been described in detail herein in accord with certain preferred embodiments thereof, many modifications and changes therein may be effected by those skilled in the art. For example, in the embodiment illustrated in FIG. 1, piezoelectric benders 20 are shown as being symmetrically arranged about a central axis so that they form a circular array. However, it should be understood that other arrangements, such as single-in-line, dual-in-line, and rectangular arrays, may also be employed. Further, the arrays may be stacked one on top of another to provide switching capability for a very large number of circuits. Also, while common electrical conductors 22 and 34 have been shown in the shape of a circular ring forming a flat structure, others shapes and configurations may be employed. Common electrical conductors 22 and 34 have also been shown as comprising metal in order to provide sufficient mechanical strength to rigidly fix one end of each of benders 20. However, other means may be used to hold benders 20 in place so that they bend in response to an applied electrical signal. Additionally, while benders 20 have been shown in the Figures as being rigidly fixed at only one end thereof, so that they bend in a springboard fashion, benders 20 may also be fixed at both ends thereof, so that they bend in the center in an inchworm configuration. Accordingly, it is intended by the appended claims to cover all such modifications and changes as fall within the true spirit and scope of the invention.

The invention claimed is:

1. An electrical current switching apparatus comprising:

a plurality of subtantially coplanar, flat piezoelectric benders of the type having at least two electrically conductive layers separated by a piezoelectric material and exhibiting bending motion in response to an electrical signal, said bending motion being in a direction substantially perpendicular to the plane in which said benders lie;

each of said benders being fixed at a first end;

an electrically insulating linking member attached between the moving ends of at least two of said piezoelectric benders;

at least one pair of electrical current switching contacts, at least one of said contacts being movable and located substantially centrally on said linking member so that said bending motion of said piezoelectric benders causes corresponding movement of said movable contact, said contacts being disposed so that said movement of said movable contact produces a change in the relative position of said pair of contacts between open and closed positions;

a common electrical conductor electrically connecting a first one of said electrically conductive layers of each of said piezoelectric benders to said electrical signal; and means for electrically connecting a second one of said electrically conductive layers of said piezoelectric benders to said electrical signal so that said benders exhibit said bending motion in response to said signal.

2. The apparatus of claim 1 wherein said piezoelectric benders are symmetrically arranged about a central axis so that they form a circular array.

3. The apparatus of claim 2 wherein said common electrical conductor comprises a circular ring of electrically conductive material, with said ring being attached to said first electrically conductive layer of each of said benders.

4. The apparatus of claim 3 wherein said common conductor comprises a structure which rigidly fixes said benders at at least one end of each of said benders.

5. The apparatus of claim 1 wherein each said piezoelectric bender comprises a bilateral piezoelectric bender of the type exhibiting bending motion in one direction in response to a first electrical signal and bending motion in the opposite direction in response to a second electrical signal, said bender being of the type having a central electrically conductive layer and two outer electrically conductive layers, with each outer layer being separated from said central layer by a piezoelectric material, and wherein said common electrical conductor electrically connects a first one of said outer electrically conductive layers of each of said benders to said first electrical signal, and said connecting means electrically connects said central electrically conductive layer of said predetermined benders to said first electrical signal.

6. The apparatus of claim 5 further comprising a second common electrical conductor electrically connecting the second one of said outer electrically conductive layers of each of said benders to said second electrical signal.

7. The apparatus of claim 6 further comprising a second assembly of said at least one pair of electrical current switching contacts mechanically linked to said at least one bender, said second assembly being located on the opposite side of said plurality of benders and configured and disposed symmetrically with respect to the first assembly of said elements.

* * * * *